US008303196B2

(12) United States Patent
Aizawa et al.

(10) Patent No.: US 8,303,196 B2
(45) Date of Patent: Nov. 6, 2012

(54) CAMERA MODULE

(75) Inventors: Toyokazu Aizawa, Fujisawa (JP); Katsuo Iwata, Yokohama (JP); Takehiro Hiramatsu, Chigasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/052,398

(22) Filed: Mar. 21, 2011

(65) Prior Publication Data
US 2011/0286736 A1    Nov. 24, 2011

(30) Foreign Application Priority Data

May 20, 2010 (JP) ................. 2010-116599

(51) Int. Cl.
*G03B 17/00*    (2006.01)
(52) U.S. Cl. ..................................... 396/529
(58) Field of Classification Search ............... 396/529
See application file for complete search history.

(56) References Cited

U.S. PATENT DOCUMENTS

| 7,702,226 B1* | 4/2010 | Gutierrez ........................ 396/25 |
| 2003/0128442 A1* | 7/2003 | Tanaka et al. ................. 359/819 |
| 2007/0210246 A1* | 9/2007 | Ellenberger et al. .......... 250/239 |
| 2007/0217786 A1* | 9/2007 | Cho et al. ....................... 396/542 |
| 2007/0253697 A1* | 11/2007 | Kim et al. ...................... 396/275 |
| 2008/0170141 A1* | 7/2008 | Tam et al. ...................... 348/294 |
| 2009/0045441 A1* | 2/2009 | Kweon et al. .................. 257/291 |
| 2009/0052887 A1* | 2/2009 | Cheng et al. ................... 396/529 |
| 2009/0085138 A1* | 4/2009 | Ryu et al. ....................... 257/434 |
| 2011/0019077 A1 | 1/2011 | Kobayashi et al. |

FOREIGN PATENT DOCUMENTS

| JP | 2007-60672 A | 3/2007 |
| JP | 2009-147576 A | 7/2009 |
| JP | 2009-296454 A | 12/2009 |

\* cited by examiner

*Primary Examiner* — Clayton E Laballe
*Assistant Examiner* — Noam Reisner
(74) *Attorney, Agent, or Firm* — Oblon, Spivak, McClelland, Maier & Neustadt, L.L.P.

(57) ABSTRACT

According to one embodiment, there is provided a camera module formed with substantially the same scale as a chip of an image sensor, includes a lens held by a lens holder, an image sensor placed in a position in which an image is formed by the lens, and a wiring board disposed between the lens and the image sensor and electrically connected to the image sensor. An opening that permits light entering the image sensor to pass therethrough is formed in the wiring board. Further, a passive component is contained in the wiring board.

11 Claims, 5 Drawing Sheets

CAMERA MODULE

CROSS-REFERENCE TO RELATED APPLICATIONS

This application is based upon and claims the benefit of priority from Japanese Patent Application No. 2010-116599, filed May 20, 2010; the entire contents of which are incorporated herein by reference.

FIELD

Embodiments described herein relate generally to a miniature camera module having the size equivalent to the chip size of an image sensor.

BACKGROUND

Recently, a chip-scale camera module (CSCM) has been attracting attention as a miniature camera module mounted on a mobile phone, mobile game machine, personal digital assistant (PDA), personal computer or the like. As the chip-scale camera module, a camera module substantially the same size as an image sensor can be obtained by using a fixed focus lens.

If an attempt is made to mount a passive component such as a capacitor on this type of camera module, it is necessary to provide a printed circuit board on the camera module and arrange the capacitor together with the image sensor on the board. Therefore, a space for disposing a capacitor and lens holder must be provided around the image sensor. As a result, the advantage of the chip-scale camera module cannot be fully exhibited and it becomes difficult to reduce the size.

Further, it is considered to arrange a board having a capacitor contained therein under the image sensor, but in this case, the height of the module increases. There is also an example in which a capacitor is disposed between the lens and the image sensor. However, this example is applied to a normal camera module with a casing sufficiently larger than the chip scale and cannot be applied to a chip-scale camera module.

DETAILED DESCRIPTION

In general, according to one embodiment, there is provided a camera module formed with substantially the same scale as a chip of an image sensor, comprising a lens held by a lens holder, an image sensor placed in a position in which an image is formed by the lens, and a wiring board disposed between the lens and the image sensor and electrically connected to the image sensor. An opening that permits light entering the image sensor to pass therethrough is formed in the wiring board. Further, a passive component is contained in the wiring board.

Next, the embodiments of this invention are explained in detail with reference to the drawings.

(First Embodiment)

Figure 1:
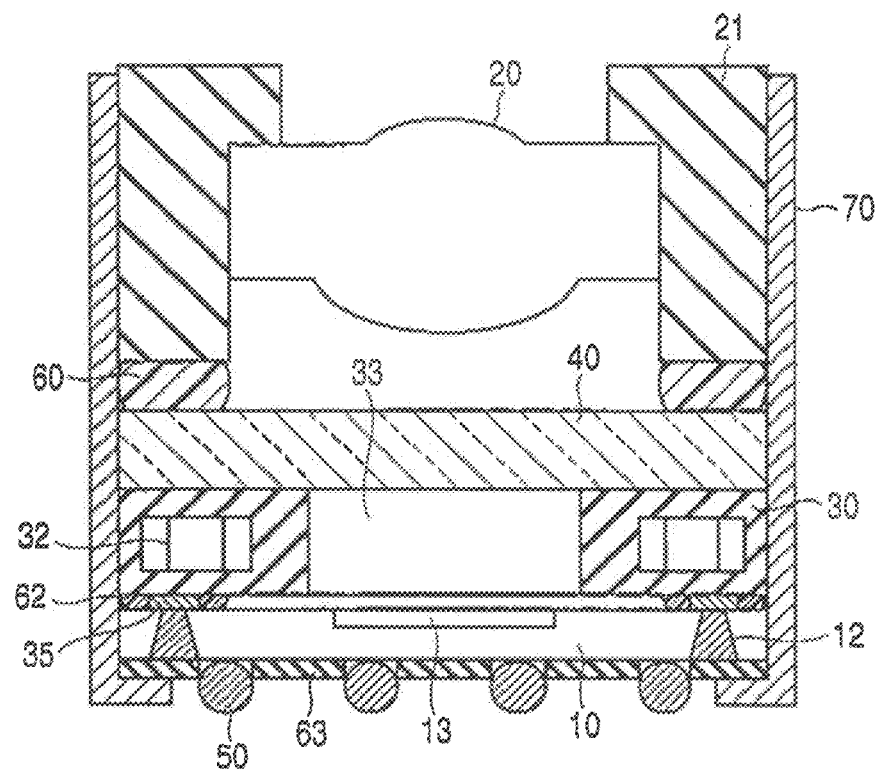
FIG. 1 is a cross-sectional view showing the schematic configuration of a chip-scale camera module according to a first embodiment.

FIG. 1 is a cross-sectional view showing the schematic configuration of a chip-scale camera module according to a first embodiment. The chip-scale camera module is a module formed with substantially the same scale as the chip of an image sensor, that is, a module in which the area of the module as viewed in a direction perpendicular to the main surface of the image sensor is substantially the same as the area of the image sensor.

A wiring board 30 having an opening portion 33 formed in the central portion to prevent light reaching a pixel unit 13 of an image sensor 10 from being shielded is disposed on the upper surface of the image sensor 10 formed of a CMOS sensor, CCD sensor or the like. A glass plate 40 is disposed on the wiring board 30. A lens holder 21 that holds a lens 20 is mounted on the glass plate 40 and the lens holder 21 is fixed to the glass plate 40 by means of an adhesive agent 60 after focus adjustment of the lens 20 has been carried out.

The outer shape of the wiring board 30, glass plate 40 and lens holder 21 is made with substantially the same size as the outer shape of the chip 10. Further, the glass plate 40 is also used as an infrared-ray cut filter (IRCF) in some cases. Additionally, an IRCF is coated on the lens 20 in some cases.

A passive component such as a capacitor 32 is contained in the wiring board 30. A measure of covering the end face of the opening portion 33 of the wiring board 30 with metal plating or resin is taken to prevent dust such as glass fiber from dropping from the end face of the opening portion 33 onto the image sensor 10. The terminals of the image sensor 10 and wiring board 30 are electrically connected to one another on the contact surface therebetween by means of flip-chip or soldering. Through electrodes 12 or side-surface electrodes (not shown) are provided on the image sensor 10 and the electrodes are electrically connected to terminals formed on the bottom surface of the image sensor 10. Solder balls 50 are arranged on the terminals on the bottom surface of the image sensor 10 and the image sensor 10 is connected to other devices by means of the solder balls 50.

A metallic shield case 70 having functions of shading and shielding is disposed to cover the side surfaces of the image sensor 10, wiring board 30, glass plate 40, holder 21 and the like. The shield case 70 may be omitted if a shading measure is taken on a device on which the present module is mounted.

In the drawing, 35 denotes an electrical terminal formed on the bottom portion of the wiring board 30, 62 an adhesive agent that adheres the image sensor 10 to the wiring board 30, and 63 an insulating film formed of a resist material or the like to protect the back surface of the image sensor 10.

With the above configuration, it is necessary to provide a space between the image sensor 10 and the lens 20 to attain adequate optical path length and the capacitor 32 can be disposed in the module without changing the module size (height) by disposing the wiring board 30 by using the space.

Figure 2:
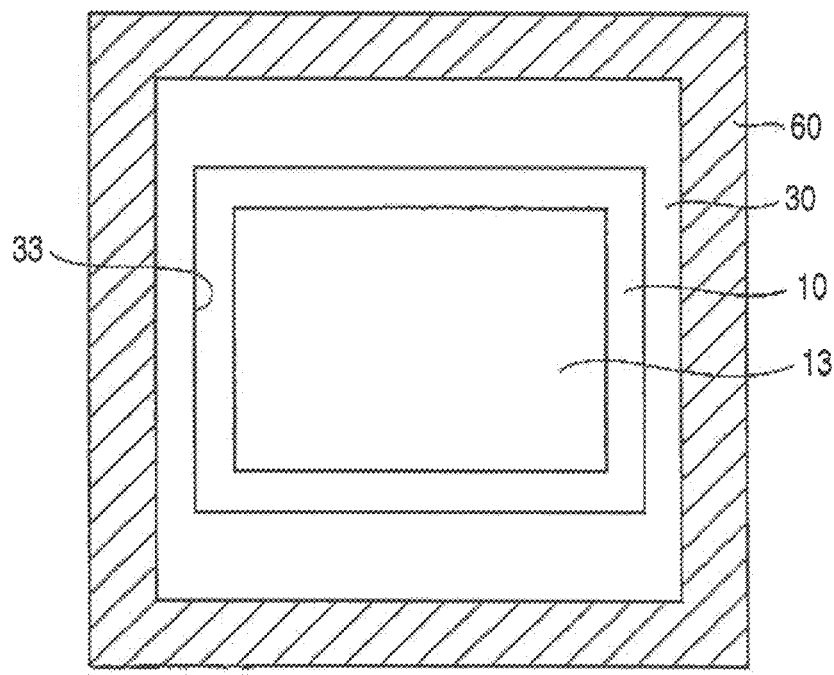
FIG. 2 is a plan view showing the structure obtained by removing a lens block from the camera module of FIG. 1 as viewed from above.

FIG. 2 is a plan view showing the structure obtained by removing a lens block from the camera module of FIG. 1 as viewed from above. An area in the peripheral portion of the wiring board 30 indicated by oblique lines is a portion on which the adhesive agent 60 used to fix the lens holder 21 is coated. Light that has passed through the lens 20 passes through the central opening portion 33 of the wiring board 30 and reaches the pixel unit 13 of the image sensor 10.

Figure 3:
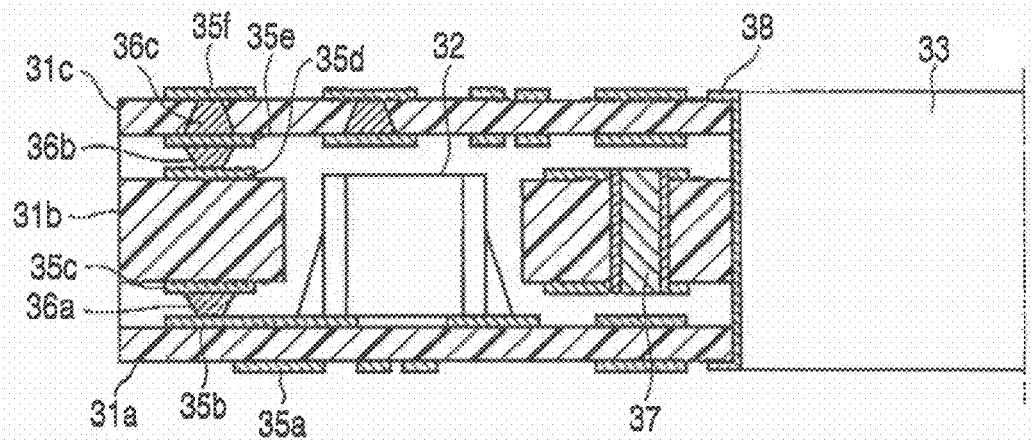
FIG. 3 is a cross-sectional view showing an example of the schematic configuration of a wiring board used in the camera module of FIG. 1.

FIG. 3 is a cross-sectional view showing an example of the concrete configuration of the wiring board 30. The wiring board 30 is a component-containing printed circuit board obtained by stacking a plurality of prepregs 31 (31a, 31b, 31c) used as electrical wiring boards. The prepregs 31 are used as insulating layers between the layers, the central prepreg 31b is disposed above the lower prepreg 31a and the upper prepreg 31c is disposed above the prepreg 31b. Wiring layers 35 (35a, 35b, 35c, 35d, 35e, 35f) are formed on the front and back surfaces of the prepregs 31. The adjacent prepregs 31 are connected by means of interlayer coupling bumps 36 (36a, 36b, 36c).

The central prepreg 31b is formed by laminating a plurality of layers and is made thicker than the other prepregs 31a, 31c. A via 37 is formed in the central prepreg 31b and an opening for disposing a passive component such as the capacitor 32 is formed. The capacitor 32 is mounted on the lower prepreg 31a and positioned in the opening portion of the central prepreg 31b.

Metal plating 38 is formed on the end face of the opening portion 33 of the wiring board 30. That is, metal plating 38 is formed on the inner wall surface of the opening portion 33 of the wiring board 30 and regions adjacent to the opening portion 33 among the front and back surfaces of the wiring board 30. Since a portion of the opening portion 33 in which dust occurs is mostly occupied by upper and lower end portions of the opening portion 33, metal plating 38 may be formed only in regions near the upper and lower end portions of the opening portion 33. Further, resin may be coated instead of metal plating.

Figure 4:
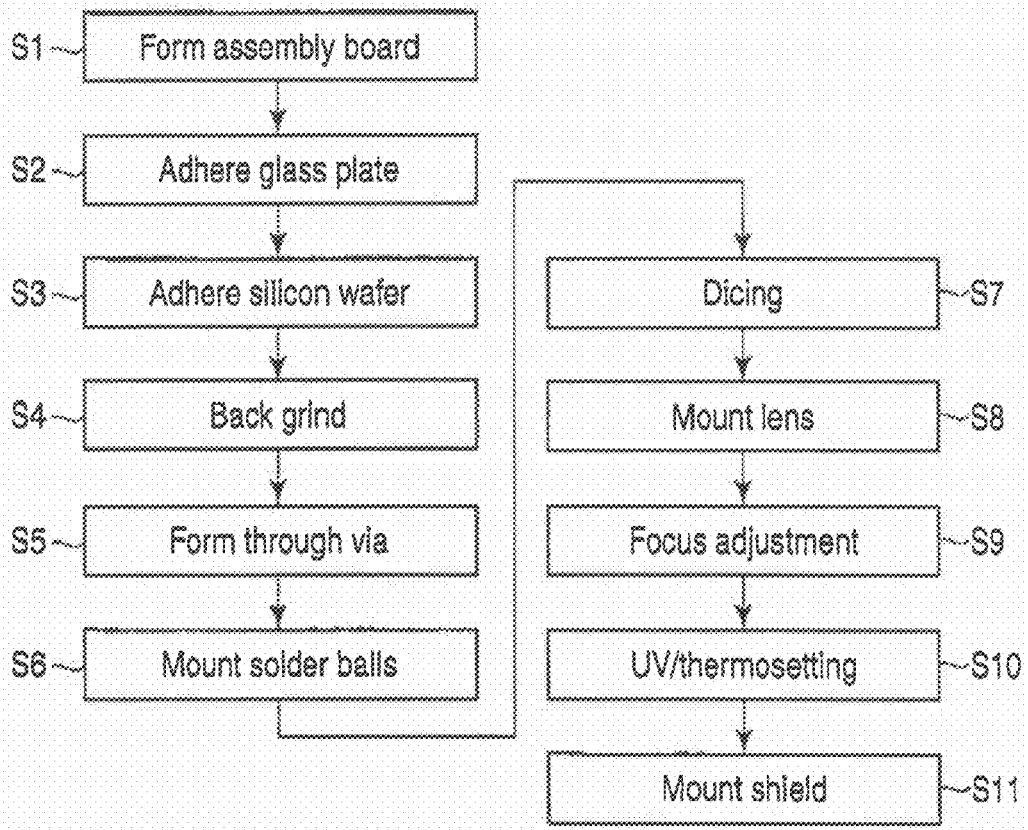
FIG. 4 is an operation flow diagram for illustrating the manufacturing process of the camera module of FIG. 1.

Next, the manufacturing method of the present embodiment is explained with reference to FIG. 4 to FIGS. 6A to 6D. FIG. 4 is a flowchart for illustrating the manufacturing process, FIGS. 5A to 5F are cross-sectional views showing the manufacturing steps for a chip portion and FIGS. 6A to 6D are perspective views showing the manufacturing steps of the entire wafer portion.

Figure 5A:
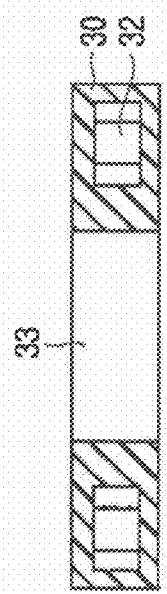
FIGS. 5A, 5B, 5C, 5D, 5E and 5F are cross-sectional views showing the manufacturing steps (chip portion) of the camera module of FIG. 1.
Figure 6A:
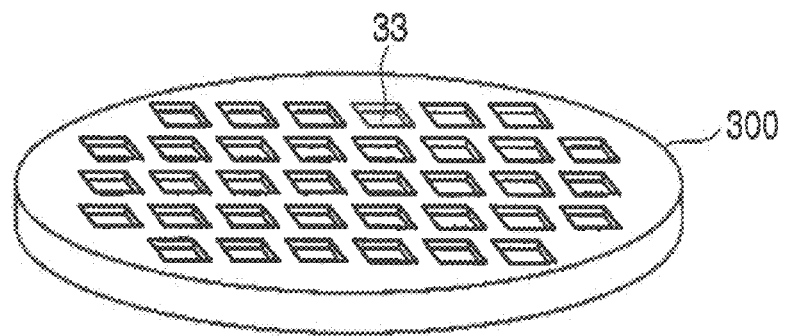
FIGS. 6A, 6B, 6C and 6D are perspective views showing the manufacturing steps (wafer portion) of the camera module of FIG. 1.

First, as shown in FIG. 5A and FIG. 6A, an assembly board 300 having the same size as a silicon wafer is formed (step S1). In the assembly board 300, board portions corresponding to a plurality of chips and opening portions 33 thereof are formed and a capacitor 32 used as a passive component is contained in each of the board portions.

Figure 5B:
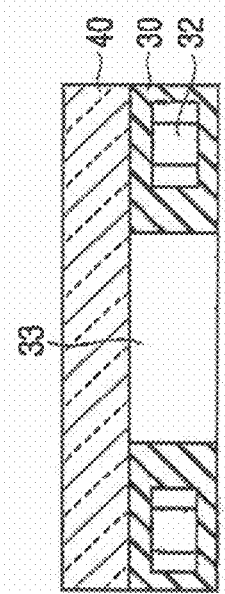
Figure 6B:
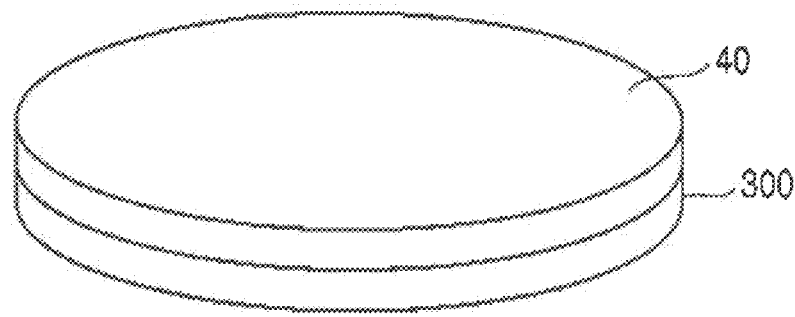

Then, as shown in FIG. 5B and FIG. 6B, a glass plate 40 having the same size as the silicon wafer is superposed on and adhered to the assembly board 300 (step S2).

Figure 5C:
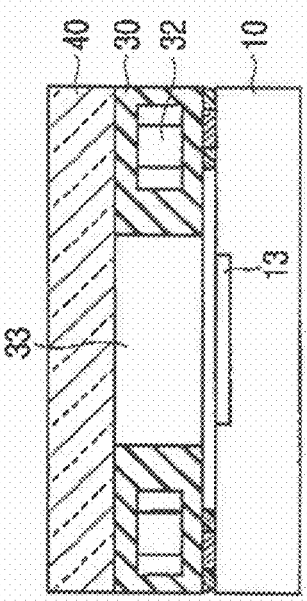
Figure 6C:
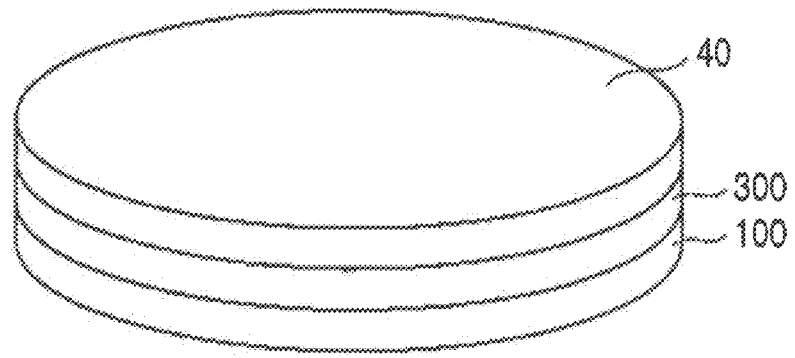

Next, as shown in FIG. 5C and FIG. 6C, a silicon wafer 100 on which a plurality of image sensors 10 are arranged is superposed on and adhered to the undersurface of the assembly board 300 (step S3). At this time, the image sensors 10 arranged on the silicon wafer 100 and the boards 30 arranged on the assembly board 300 have the same size and the same pitch and the image sensor 10 and wiring board 30 are electrically connected to each other by means of soldering or flip-chip. An opening portion 33 is formed in the central portion of each board 30 to prevent light that reaches the pixel portion 13 of the image sensor 10 from being shielded and a capacitor 32 is contained in each board 30. A measure of covering the end face of the opening portion 33 with metal plating or resin is taken to prevent dust such as glass fiber from dropping onto the pixel portion 13 of the image sensor 10.

Figure 5D:
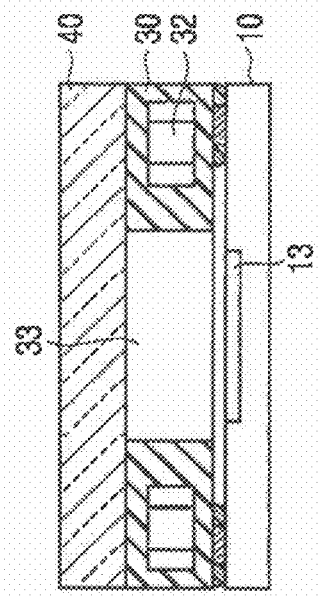
Figure 6D:
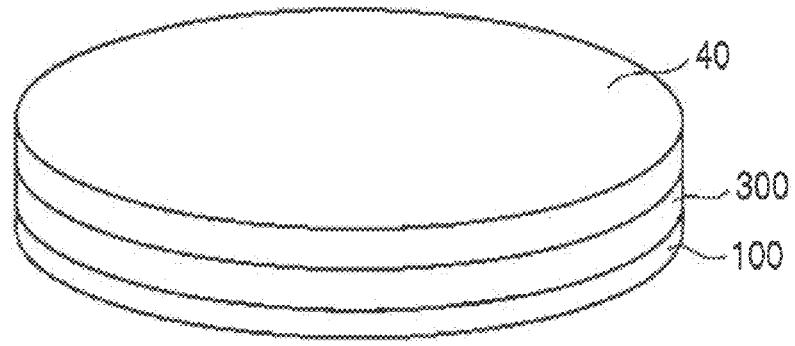

Subsequently, as shown in FIG. 5D and FIG. 6D, the process of back-grinding the silicon wafer 100 is performed to reduce the thickness of the silicon wafer 100 to a preset thickness (step S4).

Figure 5E:
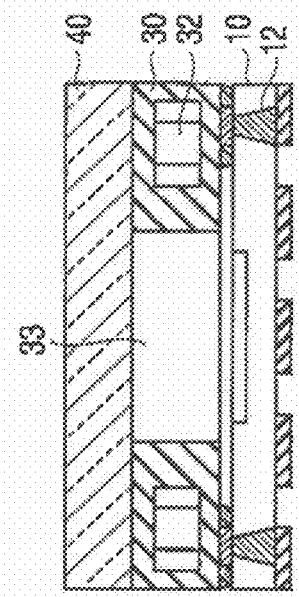
Figure 5F:
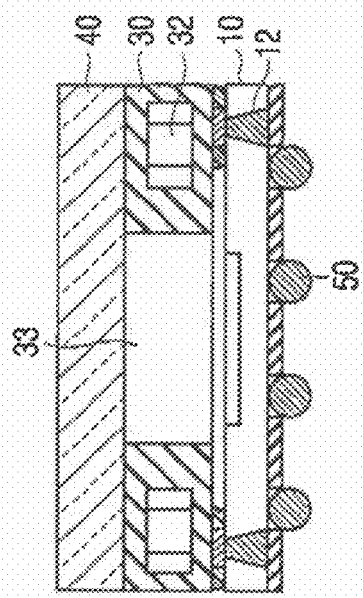

Next, as shown in FIG. 5E, vias 12 are formed in the image sensor 10 and buds (not shown) are formed on the back surface (step S5). Then, as shown in FIG. 5F, solder balls 50 are fixed to the buds (step S6).

After this, the silicon wafer 100, assembly board 300 and glass plate 40 are diced into discrete pieces (step S7). Then, a lens holder 21 that holds a lens 20 is mounted on each piece (step S8), focus adjustment is made (step S9) and the lens holder 21 is fixed to the glass plate 40 by means of an adhesive agent 60 (step S10). Finally, a shield case 70 for shading is formed to complete a module (step S11).

As described above, according to this embodiment, the wiring board 30 having the capacitor 32 mounted thereon can be mounted in the module without changing the size of the chip-scale camera module. That is, even if a space in which the capacitor 32 is disposed is not provided, the capacitor 32 can be disposed without changing the outer size and the module can be miniaturized.

Further, since the glass plate 40 is provided to cover the opening portion 33 of the wiring board 30, it is possible to prevent dust from entering the image sensor 10 from the exterior and enhance the strength of the whole portion. In addition, since a metal plating process is performed for the end face of the opening portion 33 of the wiring board 30, occurrence of dust from the end face of the opening portion 33 can be prevented.

(Second Embodiment)

Figure 7:
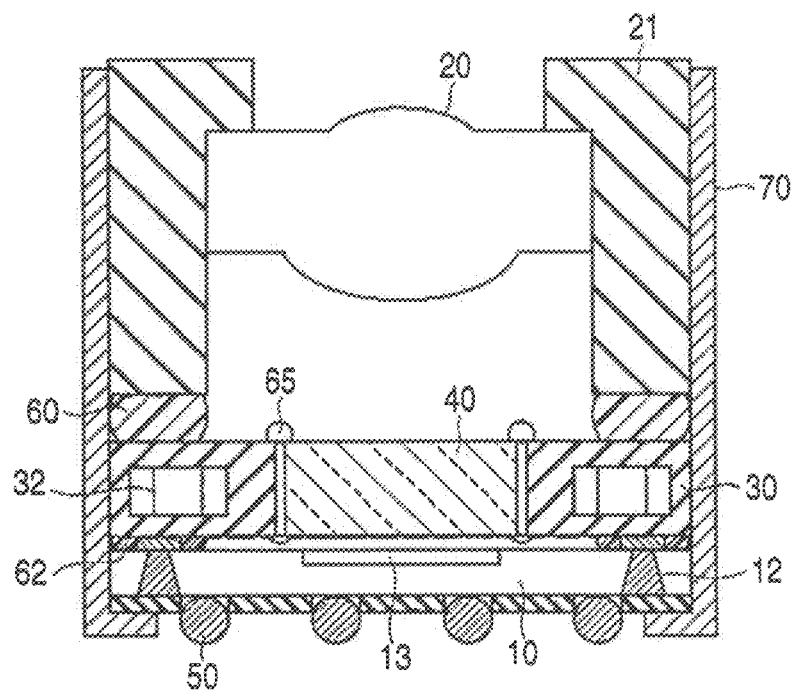
FIG. 7 is a cross-sectional view showing the schematic configuration of a chip-scale camera module according to a second embodiment.

FIG. 7 is a cross-sectional view showing the schematic configuration of a chip-scale camera module according to a second embodiment. Portions that are the same as those of FIG. 1 are denoted by the same symbols and the detailed explanation thereof is omitted.

The present embodiment is different from the first embodiment explained before in that a glass plate 40 is previously fitted into an opening portion 33 of a wiring board 30 and an adhesive agent 65 is inserted between the wiring board 30 and the glass plate 40 to adhere them. Here, adhesive agent 65 need not necessarily overflow in the top and bottom of glass plate 40.

With the above configuration, the same effect as that of the first embodiment described before can of course be obtained and occurrence of dust from the opening portion 33 of the wiring board 30 can be prevented without performing a process of covering the opening portion 33 of the wiring board 30 with metal plating or resin. Further, the total thickness of the wiring board 30 and glass plate 40 can be made thinner in comparison with that of the first embodiment. Therefore, this embodiment can be applied to a case where the distance between the image sensor 10 and the lens 20 is short.

(Third Embodiment)

Figure 8:
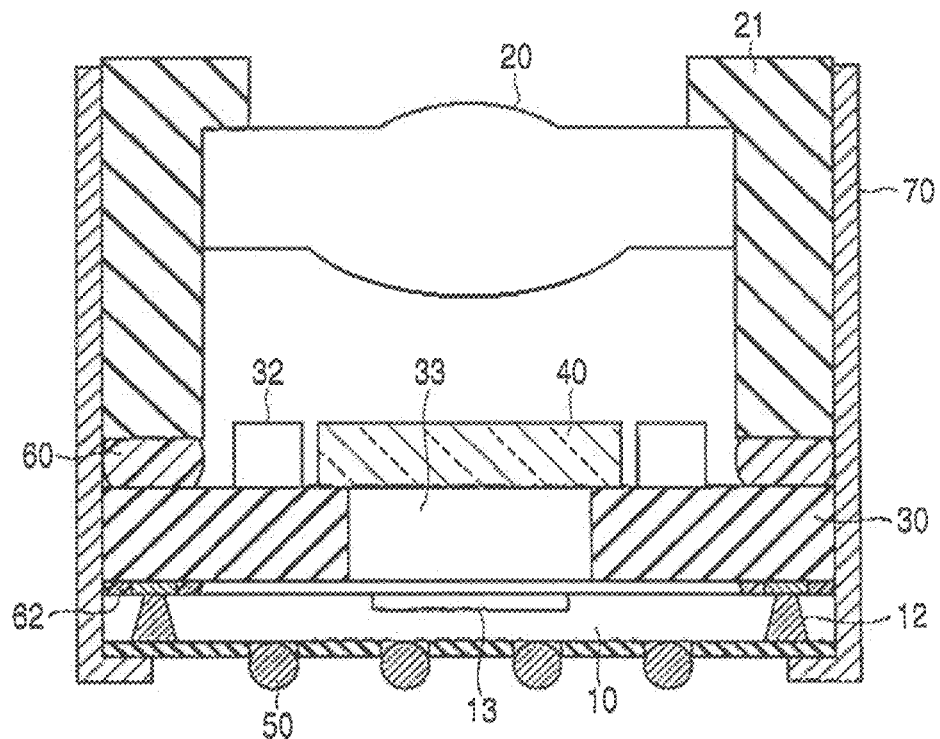
FIG. 8 is a cross-sectional view showing the schematic configuration of a chip-scale camera module according to a third embodiment.

FIG. 8 is a cross-sectional view showing the schematic configuration of a chip-scale camera module according to a third embodiment. Portions that are the same as those of FIG. 1 are denoted by the same symbols and the detailed explanation thereof is omitted.

The present embodiment is different from the first embodiment explained before in that a passive component such as a capacitor 32 is provided not in the wiring board 30 but on the wiring board 30. That is, a glass plate 40 is formed with the size slightly larger than an opening portion 33 of the wiring board 30, disposed to cover the opening portion 33 and adhered to the wiring board 30. The capacitor 32 is mounted on the wiring board 30 outside the glass plate 40.

When the size of the image sensor 10 is sufficiently larger than the size of the pixel portion 13, the capacitor 32 can be mounted on the surface of the wiring board 30 instead of being contained in the wiring board 30 as in this embodiment. In this case, the same effect as that of the first embodiment can of course be attained and the merit that the cost is reduced in comparison with a case wherein a built-in board is used can be attained.

(Modification)

This invention is not limited to the above embodiments. In the above embodiments, the glass plate is disposed between the image sensor and the lens, but the glass plate can be omitted if the image sensor portion can be sufficiently strong. Further, the passive component provided on the wiring board is not limited to the capacitor and an inductor or resistor can be used. Additionally, plural types of passive components can be provided.

The structure of the wiring board is not limited to the structure shown in FIG. 3 and can be properly changed according to the specification.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A camera module formed with substantially the same scale as a chip of an image sensor, comprising:
    a lens held by a lens holder,
    an image sensor placed in a position in which an image is formed by the lens,
    a multilayered wiring board disposed between the lens and the image sensor, the multilayered wiring board having a first opening portion that permits light entering the image sensor to pass therethrough and including a first insulating layer having first wiring layers on both surfaces of the first insulating layer, a second insulating layer having a second opening portion and second wiring layers on both surfaces of the second insulating layers and formed above the first insulating layer, the first wiring layers and the second wiring layers being selectively connected through first interlayer coupling bumps and the first wiring layers being electrically connected to the image sensor, and a third insulating layer having a third wiring layers on both surfaces of the third insulating layer and formed above the second insulating layer, the second wiring layers and the third wiring layers being selectively connected through second interlayer coupling bumps, and
    a passive component mounted above the first insulating layer in the second opening portion of the second insulating layer, covered with the third insulating layer and electrically connected to portions the first wiring layers.

2. The module according to claim 1, further comprising a glass plate disposed on the multilayered wiring board to cover the first opening portion of the wiring board.

3. The module according to claim 1, further comprising a glass plate disposed between the lens holder and the multilayered wiring board to cover the first opening portion of the multilayered wiring board.

4. The module according to claim 1, further comprising a glass plate fitted to the opening portion of the multilayered wiring board and an adhesive agent that fills a gap between the multilayered wiring board and the glass plate.

5. The module according to claim 1, wherein the passive component is a capacitor.

6. The module according to claim 1, wherein the lens holder, the multilayered wiring board and the image sensor are fixed in a cylindrical metallic shield case that is used for shielding.

7. The module according to claim 1, wherein an end face of the opening portion of the multilayered wiring board is covered with one of metal plating and resin.

8. A camera module formed with substantially the same scale as a chip of an image sensor, comprising:
    a lens held by a lens holder,
    an image sensor placed in a position in which an image is formed by the lens,
    a multilayered wiring board disposed between the lens and the image sensor, the multilayered wiring board having a first opening portion that permits light entering the image sensor to pass therethrough and including a first insulating layer having first wiring layers on both surfaces of the first insulating layer, a second insulating layer having a second opening portion and second wiring layers on both surfaces of the second insulating layers and formed above the first insulating layer, the first wiring layers and the second wiring layers being selectively connected to the image sensor, and a third insulating layer having a third wiring layers on both surfaces of the third insulating layer and formed above the second insulating layer, the second wiring layers and the third wiring layers being selectively connected through second interlayer coupling bumps,
    a passive component mounted above the first insulating layer in the second opening portion of the second insulating layer, covered with the third insulating layer and electrically connected to portions of the first wiring layers, and
    a glass plate disposed between the lens holder and the wiring board to cover the first opening portion of the multilayered wiring board.

9. The module according to claim 1, wherein the passive component is a capacitor.

10. The module according to claim 8, wherein the lens holder, the multilayered wiring board and the image sensor are fixed in a cylindrical metallic shield case that is used for shielding.

11. The module according to claim 8, wherein an end face of the first opening portion of the multilayered wiring board is covered with one of metal plating and resin.

* * * * *